United States Patent
Yang et al.

(10) Patent No.: US 11,856,706 B2
(45) Date of Patent: Dec. 26, 2023

(54) METHOD AND SYSTEM FOR IMPROVING THE OPERATION OF SEMICONDUCTOR PROCESSING

(71) Applicant: Applied Materials, Inc., Santa Clara, CA (US)

(72) Inventors: Hsui Yang, Santa Clara, CA (US); Yao-Hung Yang, Santa Clara, CA (US); Jeevan Shanbhag, Cupertino, CA (US); Chien-Min Liao, San Jose, CA (US); Earl Hunter, Lakeway, TX (US); David Ganon, Raanana (IL); Mariana Luigi, Los Gatos, CA (US); Siamak Salimian, Los Altos, CA (US); Tom K. Cho, Los Altos, CA (US); Chun-Chung Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1057 days.

(21) Appl. No.: 16/702,031

(22) Filed: Dec. 3, 2019

(65) Prior Publication Data

US 2021/0168979 A1   Jun. 3, 2021

(51) Int. Cl.
*H05K 13/08* (2006.01)
*H01L 21/67* (2006.01)

(52) U.S. Cl.
CPC ..... *H05K 13/087* (2018.08); *H01L 21/67276* (2013.01); *H01L 21/67294* (2013.01)

(58) Field of Classification Search
CPC ............ H05K 13/087; H01L 21/67276; H01L 21/67294; G05B 2219/31455; G05B 2219/37252; G05B 2219/45031; G05B 19/4183; G05B 19/4184; Y02P 90/02
See application file for complete search history.

(56) References Cited

U.S. PATENT DOCUMENTS

| | | | | |
|---|---|---|---|---|
| 6,671,570 | B2* | 12/2003 | Schulze | H01L 22/20 700/121 |
| 10,579,041 | B2* | 3/2020 | Nurani | H01L 21/67184 |
| 11,074,426 | B1* | 7/2021 | Liao | G06Q 10/087 |
| 11,513,846 | B1* | 11/2022 | Fletcher | G06F 9/5005 |
| 11,532,466 | B2* | 12/2022 | Liao | H01J 37/3288 |
| 11,641,270 | B2* | 5/2023 | Klinkner | H04L 9/006 713/189 |
| 11,717,800 | B2* | 8/2023 | Frankel | C23C 16/45544 118/716 |
| 11,721,545 | B2* | 8/2023 | Singh | C23C 16/26 438/778 |
| 11,728,139 | B2* | 8/2023 | Tran | H01J 37/32357 156/345.35 |
| 11,728,141 | B2* | 8/2023 | Rozenzon | H01J 37/3244 156/345.33 |
| 2005/0187649 | A1* | 8/2005 | Funk | G05B 23/0259 700/121 |
| 2020/0356740 | A1* | 11/2020 | Principato | G06F 16/90335 |
| 2022/0020565 | A1* | 1/2022 | Liao | H01J 37/3288 |

* cited by examiner

*Primary Examiner* — Ramesh B Patel
(74) *Attorney, Agent, or Firm* — Patterson + Sheridan, LLP

(57) ABSTRACT

The present disclosure is directed to a system and method to identify and track parts of a semiconductor processing chamber, as well as the status of the parts, and store status information in a centralized location as status changes over time.

20 Claims, 4 Drawing Sheets

METHOD AND SYSTEM FOR IMPROVING THE OPERATION OF SEMICONDUCTOR PROCESSING

BACKGROUND

Field

Embodiments of the present invention generally relate to tracking parts that are utilized in a semiconductor processing system and more particularly to improving the operation of a semiconductor processing system with part tracking data.

Description of the Related Art

Parts that are utilized in a processing chamber of a semiconductor processing tool have a substantial impact on the performance characteristics of the tool. When a tool operator is able to purchase chamber parts from a reputable source, the processing performance of the chamber can be predictable, as the quality and performance of the parts are known.

However, not all sources will provide parts with predictable performance. A tool operator may seek to save money or time by purchasing parts that they cannot verify the provenance of, purchase used components or purchase parts from other part suppliers than those recommended by the semiconductor tool manufacturer. As a result, a purchased part may not meet the performance expectations of the tool operator.

Adding to this complication, many parts of a semiconductor processing chamber must be cleaned after a certain amount of use, as residual material buildup occurs. This build-up changes the performance characteristics of a part that will eventually impact chamber performance, resulting in excursions and defects in the semiconductor devices produced in the chamber. As such, these parts must occasionally be sent to a vendor for cleaning, and possibly repair if the part is damaged. Typically, a replacement part is used in the semiconductor processing chamber, to replace the part that is out for cleaning. When such a part returns from cleaning, it may be stocked for later use or put back into service within the chamber.

Additionally, parts are retired as they reach the end of their useful lives, resulting in replacement.

Changes in chamber performance, or diagnosing performance issues, after a part has been replaced are difficult to determine, due to an incomplete understanding of the source and attributes of a replaced part. This is complicated further by a large number of replaceable parts in a chamber.

Therefore, there is a need for improved tracking of chamber parts and their performance attributes, to improve the operation of semiconductor processing tools.

What is needed is a method to track chamber parts from a supplier, authenticate the source of the parts, reliably document the chamber configuration that composed of the parts, while maintaining a record of their status and use history, in an automated manner, so that the operation of semiconductor processing tools may be improved.

SUMMARY

Certain embodiments provide a non-transitory computer readable medium comprising instructions that, when executed by a processor of a processing system, cause the processing system to perform a method for improving operation of a semiconductor processing system. The method generally includes receiving a tracking data for a part, the tracking data comprising a part identifier, and receiving a status data for the part, the status data comprising a condition of the part. The method further includes updating a chamber configuration of a chamber of a semiconductor processing tool, the configuration comprising a listing of a plurality of parts composing the chamber, the chamber configuration comprising the part identifier and condition of the part. The method further includes generating an updated condition of the part upon detection of operation of the semiconductor processing tool, and providing the status data for the part comprising the updated condition.

Some embodiments provide a method for tracking a part of a semiconductor processing tool. The method generally includes receiving a tracking data for a part, the tracking data comprising a part identifier, and receiving a status data for the part, the status data comprising a condition of the part. The method further includes updating a chamber configuration of a chamber of a semiconductor processing tool, the configuration comprising a listing of a plurality of parts composing the chamber, the chamber configuration comprising the part identifier and condition of the part. The method further includes generating an updated condition of the part upon detection of operation of the semiconductor processing tool, and providing the status data for the part comprising the updated condition.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
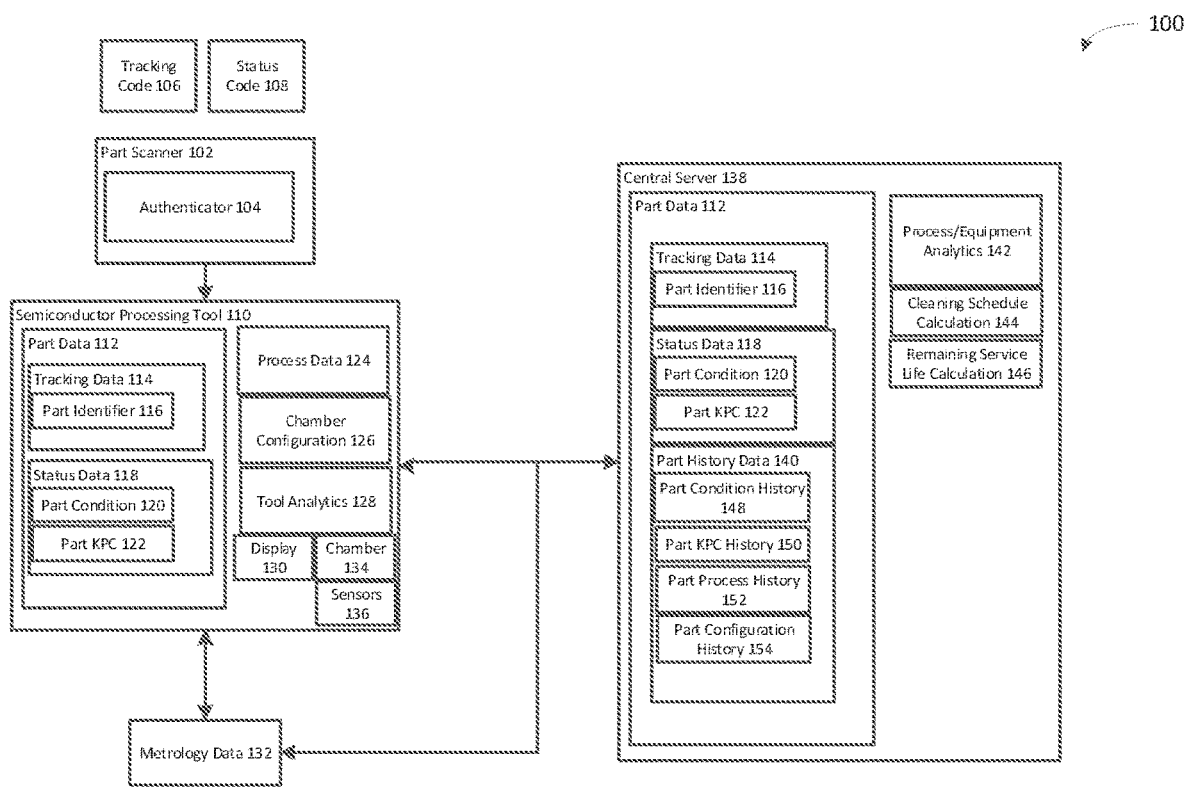
FIG. 1 depicts a system for tracking a part and its status, to improve the operation of a semiconductor processing tool, according to an embodiment.

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, a reference to "the disclosure" shall not be construed as a generalization of any inventive subject matter disclosed herein and shall not be considered to be an element or limitation of the appended claims except where explicitly recited in a claim(s).

The present disclosure is directed to a system and method to identify and track parts of a semiconductor processing chamber, as well as the status of the parts, and store status information in a centralized location as status changes over time.

When a part is received, the part itself or a label accompanying the part is scanned to acquire a tracking code and a status code. The tracking code is used to identify the part (e.g., what type of part) as well as its supplier. In embodiments, a part serial number, part number, and supplier identifier are used to authenticate that the part is from a particular manufacturer.

The status code is used to show the current state of the part by coupling the part to a database that stores both the current state and condition history. When a part is new and first received by a customer, its status is new, and it has no use history as the new part has not been used in any semiconductor processing. After the part has been used in processing, its status is updated, for example, with the number of wafers were processed using the part, information on the process with which the part was used, and a chamber configuration of which the part was used in.

When the tracking code and status code of a part is scanned into a semiconductor processing tool ("tool"), a chamber configuration is updated to show the part in the tool, the status of the part, and if the part is authenticated to a supplier approved by the tool manufacturer, a part identifier may appear in the chamber configuration display. A central server is updated with this information as well. If the part is not authenticated, the tool will still operate but the part will not display in the chamber configuration. For non-authenticated parts, the part status and history are not available in some embodiments.

As the part is used in the tool, the part status is updated to reflect the processing of the tool in which it is installed, and a part condition history will be stored as well as the status changes. This information may be stored in the tool as well as the central server.

When a part is due for a cleaning, the tool operator will remove the part from the chamber, scanning it with the part scanner to identify the removed part and capture its current status (as stored in the tool or the central server), for example, with a bar code label to be placed on the part packaging. Part status and the change in the chamber configuration may be provided to the central server as well. The part and its packaging are sent to a cleaning vendor who will scan the part labels, capturing the part ID and the part status data. Once cleaned, the cleaning vendor will scan the part label to capture the part ID and provide the part ID and an updated status to the central server. In some embodiments a printed to a bar code reflecting the updated status accompanies the part, such that when the tool operator receives the part, the updated status may be scanned into the tool.

By providing the ability to authenticate a part to an approved supplier, automatically track the part in the supply chain, know its status, and access its status history, the performance of chambers employing embodiments disclosed herein may be improved. In addition to providing increased performance and predictability in the operation of a semiconductor processing tool, should a technical problem arise, embodiments disclosed can reduce the time and resources needed to diagnose and resolve that problem.

Example System According to Embodiments

FIG. 1 depicts a system 100 for tracking a part and its status, to improve the operation of a semiconductor processing tool, according to an embodiment. A part, for purposes of embodiments, is one or more components of a semiconductor processing chamber of a semiconductor processing tool (loon 110. By way of example and not limitation, such a part could include a gasket, an o-ring, a showerhead, a component of a showerhead, a faceplate/component of a faceplate, a focus ring, a nozzle, a chamber component shield, a manifold, an isolator, a gas box, a heater, or any other component, or assembly of components, of a semiconductor processing chamber.

Part scanner 102 is provided to obtain information from a part or a label accompanying the part, and is communicatively coupled to the tool 110 via one or more of a PC controller, a factory interface, a system controller, or other system associated with a tool 110. Additional part scanners 102 may be coupled to a central server 138 (discussed below), and to systems located at parts suppliers, and vendors (e.g., cleaning vendors).

By way of example, the part scanner 102 obtains information identifying a part from a tracking code 106. The tracking code 106 may comprise a bar code, a QR code, an RFID code, a string of numbers and/or letters (or other symbols), or other instrumentality that may carry or encode a unique identifier for a part. The tracking code 106 includes a part number, a part serial number, and a supplier ID. One or more of the part number, part serial number, and supplier ID are combined into a unique identification code via a hash algorithm. The tracking code 106 may be engraved in the part, or be affixed to the part or part packaging via a label. In some embodiments, the shape of the part itself can be a component of the tracking code and scanned in via an optical sensor of the part scanner 102. Information such as part number, serial number, and supplier ID associated with tracking code 106 is stored within a semiconductor processing tool 110 ("tool") and/or the central server 138. The part scanner 102 may be configured to produce the tracking code in the form of a label (e.g., barcode, QR code, RFID code), receiving the tracking code information from one of the tool 110 and the central server 138.

The part scanner obtains status information of a part from a status code 108. The status code 108, can be one of a bar code, a QR code, an RFID code, a string of letters and/or numbers (or other symbols), or other instrumentality capable of conveying or encoding status data of the part, discussed below, and may be on the same label as the tracking code 106 The status data is stored within at least one of the semiconductor processing tool 110 and the central server 138. The part scanner 102 is configured to produce the status code in the form of a label (e.g., barcode, QR code, RFID code) in some embodiments, capable of receiving the status code from the tool 110 and/or the central server 138.

The part scanner 102 in embodiments further include an authenticator 104. The authenticator 104 receives the tracking code 106, decodes it using the hash algorithm, to a part number, a part serial number, and a supplier ID, that in turn are compared to known part number/serial number/supplier ID combinations in the tool 110 or central server 138, to authenticate the part. An authenticated part, in some embodiments, is a part that has been approved for use in the tool by a tool manufacturer. However, even if a part is not authenticated, the part may still be used in the tool. For non-authenticated parts, part information, status, condition history, and other data, and analytics that rely on that data may not be available, and thus not displayed to a user. In some embodiments, this information is not available for a chamber 134 with non-authenticated parts.

The part scanner 102 at a customer location communicates directly to the tool 110, via a wired or wireless connection. The part scanner 102 may additionally communicate with the central server 138 via the tool 110, or through a separate secure wired or wireless connection. In embodiments in which the part scanner 102 is at a supplier or a cleaning vendor location, the part scanner 102 either directly or indirectly communicates the tracking code 106 and/or the status code 108 with the tool 110 and/or the central server 138.

In some embodiments, the part scanner 102 is a dedicated scanning device, while in other embodiments the scanning function may be carried out by a device whose primary function is not scanning parts, such as a mobile computing device (e.g., mobile phone, tablet, etc.).

The semiconductor processing tool 110 may be any type of semiconductor processing equipment, a heterogeneous or homogeneous collection of such equipment, or a production facility comprised of a plurality of semiconductor processing tools.

The tool 110 stores part data 112. Part data 112 includes tracking data 114 that includes a part identifier 116. In embodiments, part identifier 116 includes a part number, a part serial number, and a supplier ID, that are acquired from the tracking code 106 via the part scanner. If the part scanner 102 is missing or unavailable, the tracking code 106 or part identifier 116 may be entered into the memory of the tool 110, or that of the central server 138, by user entry via a keyboard, pointing device (e.g., a mouse), or voice input. In some embodiments, part identifier 116 may be authenticated on the tool 110 in a manner similar to authenticator 104 of the scanner, while in other embodiments authentication may occur on the central server 138, again, in a manner similar to authenticator 104.

In embodiments, part data 112 further includes status data 118. Status data 118 stores or encodes information pertaining to the condition of a part. Status data 118 includes a part condition 120 and a part Key Performance Characteristic (KPC) 122, and may include additional data reflecting the status of a part.

Part condition 120 includes information regarding the physical condition of the part, data regarding the number of wafers a chamber configuration 126 comprising the part has processed, processing conditions of the chamber 134 to which the part has been exposed. Part condition 120 may additionally include whether or not a part is clean, RF hours, wafer count, number of times the part has been refurbished, and may include data reflecting calculations of buildup/wear on the part based upon process conditions.

Part KPC 122 includes one or more attributes of the part, such as one or more of flatness, roughness, and thickness of a part at the time of placement in the chamber configuration 126 (e.g., initial use of a new or cleaned part) or estimated as a result of processing conditions in the tool 110. Part KPC 122 may additionally include equipment condition (e.g., in terms of operating temperature parameters, time in operation, and the like) for production and/or cleaning of the part. At least a portion of the part condition 120 and/or part KPC 122 may be acquired from the status code 108. Moreover, status data 118, as well as part condition 120 and/or part KPC 122 may be communicated to the central server 138, or receive updates to the part condition 120 and/or part KPC 122 from the central server 138.

In embodiments, the tool 110 stores, or has access to, process data 124. Process data 124 includes data on the semiconductor process employed in the processing of wafers in the tool 110. This may include data on what type of process (e.g., CVD, PVD, epitaxial, ALD, etc.), the number of wafers processed, chamber 134 conditions generally, and/or within particular regions of the chamber 134 (e.g., temperature, pressure, gas flow rate, radiation density/intensity, RF signal strength, optical/visual data), wafer condition data, semiconductor device/structure data (e.g., metrology). Process data 124 is included as part of the part condition 120. In some embodiments, process data 124 is be communicated to the central server 138.

The tool 110 stores, or can access, a chamber configuration 126. Chamber configuration 126 is a listing of parts present in a given chamber of the tool and includes part identifier 116 and/or status data 118 of one or more parts placed into the tool. The parts to which a particular part identifier 116 is associated with is placed into a physical processing chamber 134 of the tool 110. A display 130 may be configured to visually indicate parts in the chamber configuration 126, by displaying one or more of the part identifier 116, part condition, 120, and part KPC. As discussed above, a part may be non-authenticated, and in these embodiments, although the tool 110 may function, the non-authenticated part may not appear in the display 130.

The tool 110 stores, or can access, tool analytics 128. Tool analytics 128 includes data regarding the processing conditions of tool 110, and in some embodiments receives data from one or more of part identifier 116, part condition 120, part KPC 122, process data 124, and chamber configuration 126. Data included in tool analytics 128 may be displayed to a user via display 130. In embodiments, tool analytics 128 includes one or more algorithms that use data from one or more part condition 120, process data 124, chamber configuration 126, and metrology data 132 (discussed below) to predict when a part will need to be cleaned or replaced.

The system 100 may optionally store or access metrology data 132, in communication with the tool 110, obtained from one or more sensors 136 associated with the tool 110, in connection with processing wafers in the chamber 134. Metrology data 132 may be communicated to the central server 138 in some embodiments.

The central server 138 stores or can access part data 112, part history data 140, processing equipment analytics 142, cleaning schedule calculation 144, and remaining life calculation 146. The central server 138 may accompany the tool 110 at a customer facility, or be located remotely at a different customer site, a vendor site, tool manufacturer facility, and accessed via a secure network. The central server 138 may be a single computer system, multiple computer systems (located together or distributed), or may be exist virtually in a cloud computing environment, or a combination of these.

Part history data 140 includes part condition history 148. Part condition history 148 receives data from part condition 120, as part condition 120 changes, storing the changes as time-series data. As discussed above, a part condition 120 may change as a result of a part being placed in an operating tool 110, or by a cleaning vendor who updates the condition of the part after cleaning. The part condition history 148 keeps time series data of part condition 120.

Part history data 140 includes part KPC history 150. Similar to part condition history 148, part KPC history 150 is time-series data of the part KPC 122, updated as the part KPC 122 changes.

Part history data 140 includes part process history 152. Part process history 152 is a time series record storing the process data 124 of the tool 110 during the time that the part was in the chamber configuration 126. In some embodiments, only process data 124 related to the part is recorded in the part process history 152, while in other embodiments, all process data 152 generated while the part was part of the chamber configuration 126 is recorded as part process history 152.

Part history data 140 includes part configuration history 154. Part configuration history 154 is a time series record storing the chamber configuration 126 of the tool 110 during the time that the part was part of the chamber configuration 126, and may include one or more other parts that were in the chamber configuration 126 concurrently.

Processing equipment analytics 142 of the central server 138 takes as input one or more of part data 112, part history data 140, process data 124, chamber configuration 126, tool analytics 128 and metrology data 132. Using this data, process equipment analytics 142 measure performance of a particular tool or class of tools, and generate recommendations to update a particular tool or class of tools, or their processes/recipes, to operate more effectively.

Central server 138, in embodiments, includes the cleaning schedule calculation 144. Although parts suppliers, tool manufacturers, and tool owners may estimate cleaning cycles for a given part that is used in a particular process, cleaning schedule calculation 144 may be used to more accurately determine when a part needs to be cleaned. Cleaning schedule calculation 144, takes as input, for example, tracking data 114, status data 118, part history data 140, and uses one or more of these components to identify an impact of the cleanliness of a part on a semiconductor processing step (or recipe) being run by the tool, to accurately determine when a part needs to be cleaned. This enables the tool operator to continue to operate the tool 110 as long as possible, or, identify potential problems with a part early, before losing too many wafers to excursions of defects.

In embodiments, central server 138 may include a remaining service life calculation 146. Although parts suppliers, tool manufacturers, and tool owners may provide estimates as to when a part being used in the tool 110 should be retired, the actual service life of a part can vary depending upon the chamber configurations and semiconductor processes in which it has been a part of. Remaining service life calculation 146, in embodiments, takes input data from one or more of part data 112 and part condition history 140, and calculates the useful remaining life of a part, for example, in terms of the number of wafers to be processed.

Example Process According to Embodiments

Figure 2:
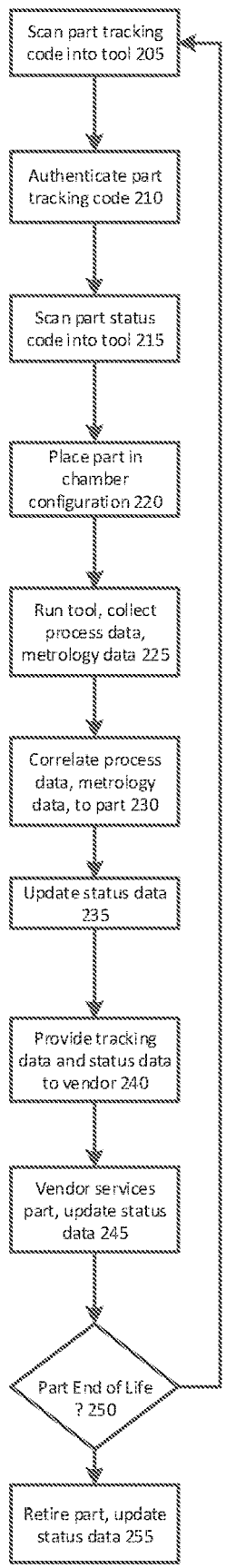
FIG. 2 depicts a process for tracking a part and its status, to improve the operation of a semiconductor processing tool, according to an embodiment.

FIG. 2 depicts a process 200 for tracking a part and its status, to improve the operation of a semiconductor processing tool, according to an embodiment.

At operation 205 the tracking data of a part is scanned into a semiconductor processing tool ("tool"). In some embodiments, the tracking data may alternatively, or additionally, be provided to a central server.

At operation 210 the tracking data is authenticated. This authentication, in some embodiments, may be based upon a part number, a serial number, a supplier ID. In other embodiments, other identifiers that may be used to identify a part that is static, such that they don't change over time, such as its physical shape, date of manufacture, place of manufacture, materials which make up its physical form. In embodiments, the data used to authenticate the part may be hashed to form a tracking code, that in turn may be stored as a bar code, QR code, RFID chip, or other media capable of being read by a scanner or other sensor. In alternative embodiments, a person may enter the tracking code into the tool via a keyboard, mouse, verbal command, or other I/O device capable of transmitting the code, via a user interface.

At operation 215, a status code for the part is scanned into the tool. As discussed above, the status data may include the physical state of the part. In embodiments, the status data may be updated as the part is used in the processing of semiconductor products.

At operation 220, the part is placed into a chamber configuration of the tool, updating the chamber to show that the part is in the tool. In embodiments, a part that has not been authenticated will not be identified in a display of the chamber configuration, but the tool will still be able to function using the non-authenticated part.

At operation 225, the tool is operated to process semiconductor products. Process data and metrology data are collected as part of this operation.

At operation 230, process data and metrology data are correlated to the parts in the chamber configuration.

At operation 235, the status data of each part in the chamber configuration are updated to reflect the data correlated to each part. In some embodiments, all process and metrology data may be used to update the status data of each part, in addition to data that has been correlated to each part.

At operation 240, a user provides the tracking data and status data to a vendor, such as a cleaning vendor. For example, the user may print the status data as a label that accompanies the part.

At operation 245, the vendor services the part, for example, by cleaning the part. Once the service is provided, the vendor updates the status data. In some embodiments, the vendor provides the status data via a printed label, while in other embodiments the vendor updated status data is additionally, or alternatively, provided to a central server 138, or to the tool 110.

At operation 250 a determination is made, based on the status data if the part is at its end of life. If the determination is made that the part is at its end of life, the status data is updated to reflect this state, and the process proceeds to 255 at which the part is retired. Otherwise, the part is provided to a user, and the process proceeds to 205.

Example Method According to Embodiments

Figure 3:
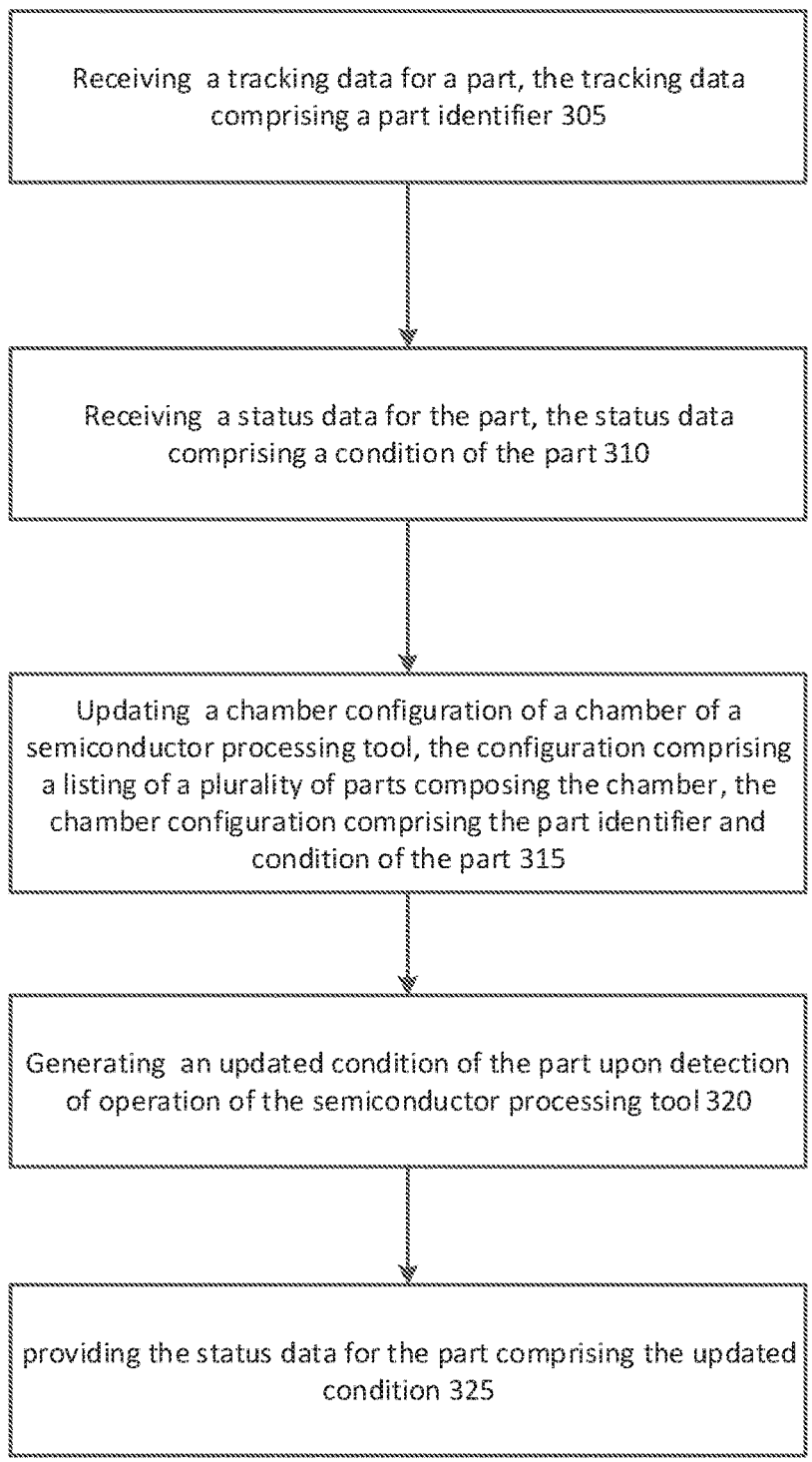
FIG. 3 depicts a method for improving the operation of semiconductor processing, according to an embodiment.

FIG. 3 depicts a method 300 for improving the operation of semiconductor processing, according to an embodiment.

At operation 305 the method receives tracking data for a part, the tracking data comprising a part identifier. In embodiments, the method further comprises authenticating the part identifier, and upon successful authentication, displaying the part identifier to a user as part of the chamber configuration. In some embodiments, the method further comprises not displaying the part identifier as part of the chamber configuration upon unsuccessful authentication. In some embodiments receiving the part tracking data comprises receiving the part tracking data from a bar code scanner, and receiving the status data comprises receiving the status data from the bar code scanner.

At 310, the method continues, receiving status data for the part, the status data comprising a condition of the part. In embodiments, the part condition is updated with one or process data, chamber configuration data, and metrology data. In embodiments, a part condition history may be updated with the updated condition. A cleaning schedule may be determined for the part based on the part condition history. In embodiments, the method further comprises storing at least one of the part condition and updated part condition in a central server.

The method continues at operation 315, updating a chamber configuration of a chamber of a semiconductor processing tool, the configuration comprising a listing of a plurality of parts composing the chamber, the chamber configuration comprising the part identifier and condition of the part. In embodiments, the chamber configuration is stored in a central server.

The method continues at operation 320, generating an updated condition for the part upon detection of the operation of the semiconductor processing tool.

The method continues at operation 325, providing the status data for the part comprising the updated condition.

Example Processing System According to Embodiments

Figure 4:
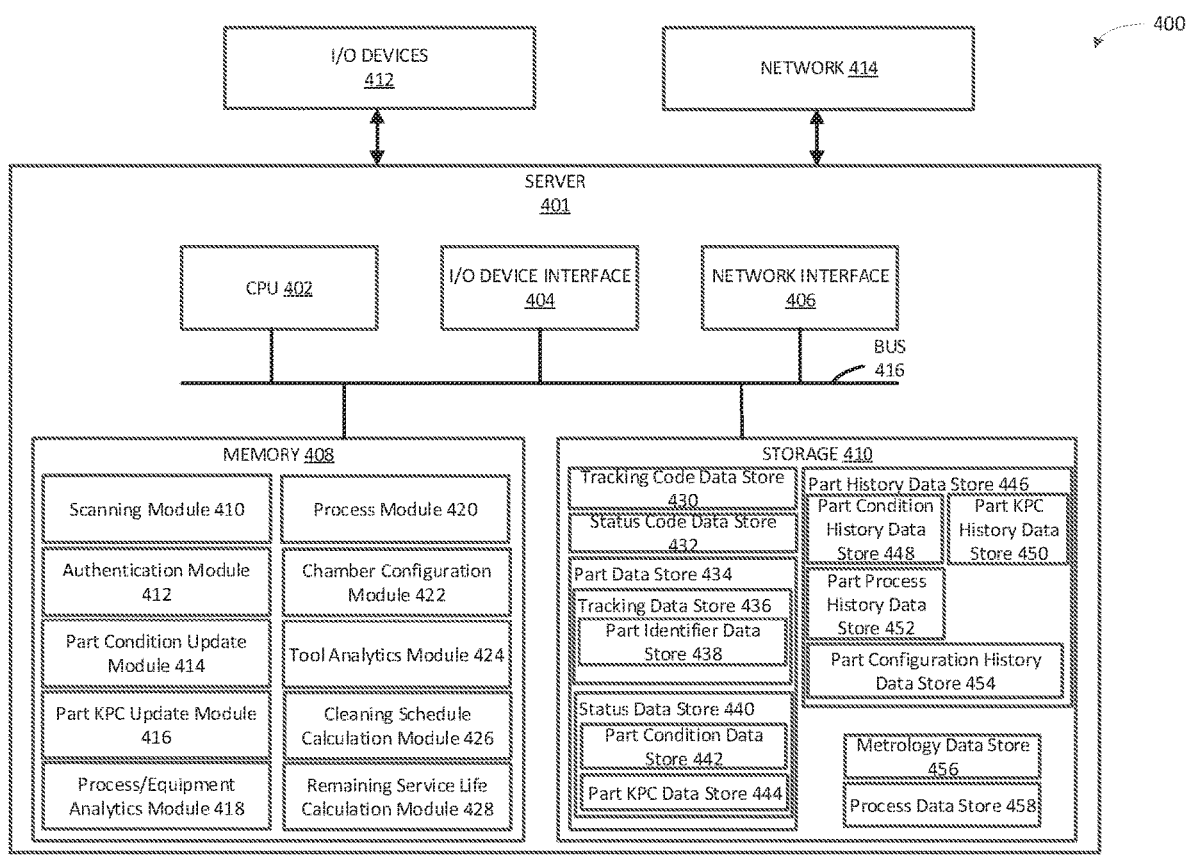
FIG. 4 depicts a processing system for improving the operation of semiconductor processing, according to an embodiment.

FIG. 4 depicts a processing system for improving the operation of semiconductor processing, according to an embodiment.

Processing system 400 includes a CPU 402 connected to a bus 416. CPU 402 is configured to process computer-readable instructions, such as stored in memory 408 and/or storage 410 and to cause processing system 400 to perform methods as described herein, for example with respect to FIGS. 2, 3, and 4. CPU 402 is included to be representative of a single CPU, multiple CPU's, a single CPU having multiple processing cores, and other forms of processing architecture capable of executing computer-readable instructions. In some embodiments, CPU 402 may be located, in whole or in part, remotely and accessed via a network.

Processing system 400 includes an I/O device interface 404 to provide access to I/O devices 412 and a network interface 406 to provide access to a network 414.

Processing system 400 further includes a memory 408, which in embodiments includes a plurality of modules.

The processing system 400 may be a single system, however in embodiments comprises multiple discrete systems, such as described above with regard to part scanner 102, tool 110, metrology data 132, and central server 138.

By way of example, memory 408 includes a scanning module 410 that is configured to perform scanning operations as described above (e.g., with respect to FIGS. 1, 2, 3).

Memory 408 further includes an authentication module 412 that is configured to perform authentication operations as described above.

Memory 408 further includes a part condition update module 414 that is configured to update a part condition as described above.

Memory 408 further includes a part KPC update module 416 that is configured to update a part KPC as described above.

Memory 408 further includes a process/equipment analytics module 418 that is configured to perform process/equipment analytics as described above.

Memory 408 further includes a process module 420 configured to perform tool processing operations as described above.

Memory 408 further includes a chamber configuration module 422 configured to perform chamber configuration operations as described above.

Memory 408 further includes tool analytics module 424 configured to perform tool analytics as described above.

Memory 408 further includes a cleaning schedule calculation module 426 configured to perform cleaning schedule calculations as described above.

Memory 408 further includes a remaining service life calculation module 428 configured to perform remaining service life calculations as described above.

Note that while shown as a single memory 408 in FIG. 4 for simplicity, the various aspects stored in memory 408 may be stored in different physical memories, but all accessible to CPU 402 via internal data connections such as bus 416. Alternatively, various aspects stored in memory 408 may be stored in one or more physical memories located outside of the processing system 400 and accessed via the network 414.

Processing system 400 includes a storage 410, which in embodiments includes a tracking code data store 430. Tracking code data store 430 may be related to tracking code 106 of FIG. 1.

Storage 410 further includes a status code data store 432, which may be related to status code 108.

Storage 410 further includes a part data store 434, which includes tracking data store 436, part identifier data store 438, status data store 440, part condition data store 442, and part KPC data store 444. The part data store 434, and its components may be related to part data 112, tracking data 114, part identifier 116, status data 118, part condition 120, and part KPC 122, respectively, of FIG. 1.

Storage 410 further includes a part history data store 446, which includes part condition history data store 448, part KPC history data store 450, Part process history data store 452, and part configuration history data store 154. The part history data store 446, and its components may be related to part history data 140, part condition history 148, part KPC history 150, part process history 152, and part configuration history 154, respectively, of FIG. 1.

Storage 410 further includes a metrology data store 456, which may be related to metrology data 132 of FIG. 1.

Storage 410 further includes a process data store 458, which may be related to process data 124 of FIG. 1.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

The following claims are not intended to be limited to the embodiments shown herein but are to be accorded the full scope consistent with the language of the claims. Within a claim, a reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims.

What is claimed is:

1. A non-transitory computer-readable medium comprising instructions that, when executed by a processor of a processing system, cause the processing system to perform a method for improving operation of semiconductor processing system, the method comprising:
   receiving a tracking data for a part, the tracking data comprising a part identifier;
   receiving a status data for the part, the status data comprising a condition of the part;
   updating a chamber configuration of a chamber of a semiconductor processing tool, the configuration comprising a listing of a plurality of parts composing the chamber, the chamber configuration comprising the part identifier and condition of the part;
   generating an updated condition of the part upon detection of operation of the semiconductor processing tool; and
   providing the status data for the part comprising the updated condition.

2. The computer-readable medium of claim 1 wherein the part condition is updated with one of process data, chamber configuration data, and metrology data.

3. The computer-readable medium of claim 2 wherein a part condition history is updated with the updated condition.

4. The computer-readable medium of claim 3 further comprising determining a cleaning schedule for the part based on the part condition history.

5. The computer-readable medium of claim 1 further comprising authenticating the part identifier, and upon successful authentication, displaying the part identifier to a user as part of the chamber configuration.

6. The computer-readable medium of claim 5 further comprising not displaying the part identifier as part of the chamber configuration upon unsuccessful authentication.

7. The computer-readable medium of claim 1 wherein providing the status data comprises causing a label to be printed.

8. The computer-readable medium of claim 1 wherein receiving the part tracking data comprises receiving the part tracking data from a bar code scanner, and receiving the status data comprises receiving the status data from the bar code scanner.

9. The computer-readable medium of claim 1 wherein the chamber configuration is stored in a central server.

10. The computer readable medium of claim 1 further comprising storing at least one of the part condition and updated part condition in a central server.

11. A method for tracking a part of a semiconductor processing tool, the method comprising:
    receiving a tracking data for a part, the tracking data comprising a part identifier;
    receiving a status data for the part, the status data comprising a condition of the part;
    updating a chamber configuration of a chamber of a semiconductor processing tool, the configuration comprising a listing of a plurality of parts composing the chamber, the chamber configuration comprising the part identifier and condition of the part;
    generating an updated condition of the part upon detection of operation of the semiconductor processing tool;
    providing the tracking data for the part;
    providing the status data for the part comprising the updated condition.

12. The method of claim 11 wherein the part condition is updated with one of process data, chamber configuration data, and metrology data.

13. The method of claim 12 wherein a part condition history is updated with the updated condition.

14. The method of claim 13 further comprising determining a cleaning schedule for the part based on the part condition history.

15. The method of claim 11 further comprising authenticating the part identifier, and upon successful authentication, displaying the part identifier to a user as part of the chamber configuration upon successful authentication.

16. The method of claim 15 further comprising not displaying the part identifier as part of the chamber configuration upon unsuccessful authentication.

17. The method of claim 11 wherein providing the status data comprises causing a label to be printed.

18. The method of claim 11 wherein receiving the part tracking data comprises receiving the part tracking data from a bar code scanner, and receiving the status data comprises receiving the status data from the bar code scanner.

19. The method of claim 11 wherein the chamber configuration is stored in a central server.

20. The method of claim 11 further comprising storing at least one of the part condition and updated part condition in a central server.

* * * * *